US006879988B2

(12) United States Patent
Basin et al.

(10) Patent No.: US 6,879,988 B2
(45) Date of Patent: Apr. 12, 2005

(54) SYSTEM AND METHOD FOR MANIPULATING AND MANAGING COMPUTER ARCHIVE FILES

(75) Inventors: Yuri Basin, Thiensville, WI (US); Michael J. Beirne, Milwaukee, WI (US); James C. Peterson, Menomonee Falls, WI (US); Karen L. Peterson, Menomonee Falls, WI (US)

(73) Assignee: PKWare, Brown Deer, WI (US)

( * ) Notice: Subject to any disclaimer, the term of this patent is extended or adjusted under 35 U.S.C. 154(b) by 270 days.

(21) Appl. No.: 09/803,355

(22) Filed: Mar. 9, 2001

(65) Prior Publication Data

US 2002/0120639 A1 Aug. 29, 2002

Related U.S. Application Data

(60) Provisional application No. 60/187,969, filed on Mar. 9, 2000.

(51) Int. Cl.[7] .......................... G06F 17/30; G06F 12/00
(52) U.S. Cl. ........................... 707/200; 707/707; 707/1; 707/101; 707/102; 717/176; 717/100; 717/175
(58) Field of Search ............................... 707/1, 5, 100, 707/101, 102, 200, 204; 717/100, 175, 176; 341/51

(56) References Cited

U.S. PATENT DOCUMENTS

| 5,051,745 | A | | 9/1991 | Katz | |
|---|---|---|---|---|---|
| 5,463,772 | A | * | 10/1995 | Thompson et al. | 707/101 |
| 5,745,756 | A | * | 4/1998 | Henley | 707/204 |
| 5,771,355 | A | * | 6/1998 | Kuzma | 709/232 |
| 5,778,374 | A | * | 7/1998 | Dang et al. | 707/101 |
| 5,781,901 | A | * | 7/1998 | Kuzma | 707/10 |
| 5,813,011 | A | * | 9/1998 | Yoshida et al. | 707/101 |

(Continued)

FOREIGN PATENT DOCUMENTS

JP  9-223052  * 8/1997  ........... G06F/12/00

OTHER PUBLICATIONS

Web Site information: home.worldnet.fr/mounierr/HomePage.html; Welcome to Arjfolder Official Site; pp. 1–2.
Web Site information: cleverness.com/cleverzip/browse/explorer.html; Explorer View; p. 1.
Web Site information: creative.net/–acco/; AECO Systems Presents . . . Zip Explorer Pro v2.54; p. 1.
Web Site information: knoware.com/in32docs/index.html; Knoware, Inc. Award–Winning Internet Utilities; pp. 1–2.
Web Site information: knoware.com/in32docs/screenshots.html; Knoware, Inc. Award–Winning Internet Utilities; pp. 1–3.
Web Site information: netexploer.de/english/featuers.htm; FTP in A New Generation; pp. 1–2.
Web Site information: ijenix.com/zipmagic2000.asp; MIJENIX Corporation; pp. 1–2.
Web Site information: netzip.com/products/Info_Netzip_Win.html; Netzip 5 Top Internet Programs; pp. 1–3.
Web Site information: mijenix.com/zm2000primer.asp; Zipmagic2000 Compression Primer–MIJENIX Corporation; pp. 1–2.

*Primary Examiner*—Frantz Coby
(74) *Attorney, Agent, or Firm*—McAndrews, Held & Malloy

(57) ABSTRACT

A computer program for managing and manipulating archive zip files of a computer. The program includes a system and method for opening, creating, modifying, and extracting zip archive files. The program is fully integrated into Microsoft Windows Explorer and is accessed via Explorer menus, toolbars, and/or drag and drop operations. An important feature of the program is the archive manager which may be used to open a zip file, create a new zip file, extract zip files, modify zip files, etc. The program is integrated into Microsoft Windows Explorer using the shell name space extension application program interface developed by Microsoft.

29 Claims, 13 Drawing Sheets

U.S. PATENT DOCUMENTS

| | | | | |
|---|---|---|---|---|
| 5,838,996 A | * | 11/1998 | DeCarmo | 395/888 |
| 5,854,597 A | * | 12/1998 | Murashita et al. | 341/51 |
| 5,903,723 A | * | 5/1999 | Beck et al. | 709/200 |
| 5,907,703 A | * | 5/1999 | Kronenberg et al. | 395/681 |
| 5,956,733 A | * | 9/1999 | Nakano et al. | 707/204 |
| 6,078,921 A | * | 6/2000 | Kelley | 707/10 |
| 6,112,211 A | * | 8/2000 | Bradshaw et al. | 707/205 |
| 6,157,706 A | * | 12/2000 | Rachelson | 379/100.08 |
| 6,275,848 B1 | * | 8/2001 | Arnold | 709/206 |
| 6,345,288 B1 | * | 2/2002 | Reed et al. | 709/201 |
| 6,356,937 B1 | * | 3/2002 | Montville et al. | 709/206 |
| 6,381,742 B2 | * | 4/2002 | Forbes et al. | 717/176 |
| 6,487,278 B1 | * | 11/2002 | Skladman et al. | 379/88.13 |
| 6,498,835 B1 | * | 12/2002 | Skladman et al. | 379/88.12 |
| 6,546,417 B1 | * | 4/2003 | Baker | 709/206 |

* cited by examiner

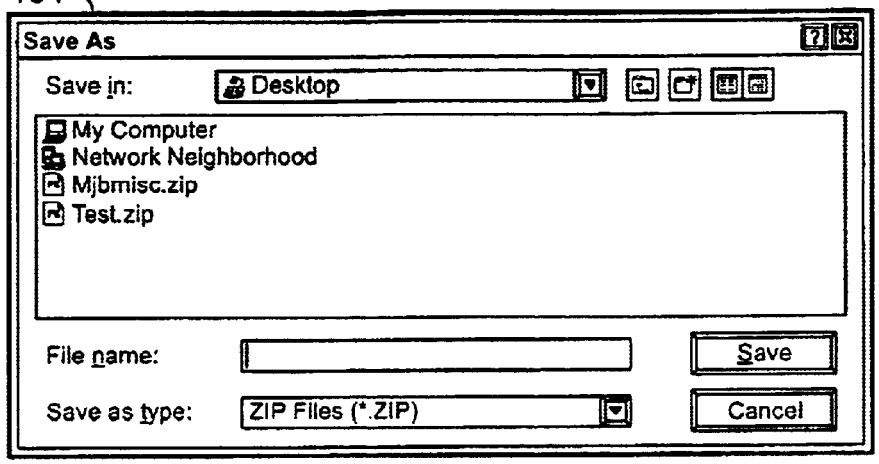

FIG. 5

| Button: | Description: |
|---|---|
| 🖫 | Save the contents of the .ZIP file. |
| 📂 | Extract file(s) via the Extract dialog. |
| ⊞ | Add file(s) via the Add dialog. |
| ☑ | Display Log file. Green color indicates that previous PKZIP Explorer operation completed without errors. |
| ☒ | Display Log file. Red color indicates that errors were encountered during the previous PKZIP Explorer operation. |
| ✎ | Invoke the Options/Properties tab dialog where you may specify several PKZIP Explorer configuration parameters. |

| Item (Menu): | Description: |
|---|---|
| Test (File) | Test the contents of the .ZIP file. |
| Extract (File) | Extract file(s) via the Extract dialog. |
| Add (File) | Add file(s) via the Extract dialog. |
| Save (File) | Save the contents of the .ZIP file. |
| Save As (File) | Save the contents of the .ZIP file to another file and open that file in PKZIP Explorer. |
| Save Copy As (File) | Save the contents of the .ZIP file to another file but remain in the current PKZIP Explorer window. |
| Columns (View) | Specify which information columns (e.g. CRC32) you want PKZIP Explorer to display in the right pane. |
| Show Log (View) | Invoke the Log dialog. |
| PKZIP Options (View) | Invoke the Options/Properties tab dialog where you may specify several PKZIP Explorer configuration parameters. |

FIG. 6B

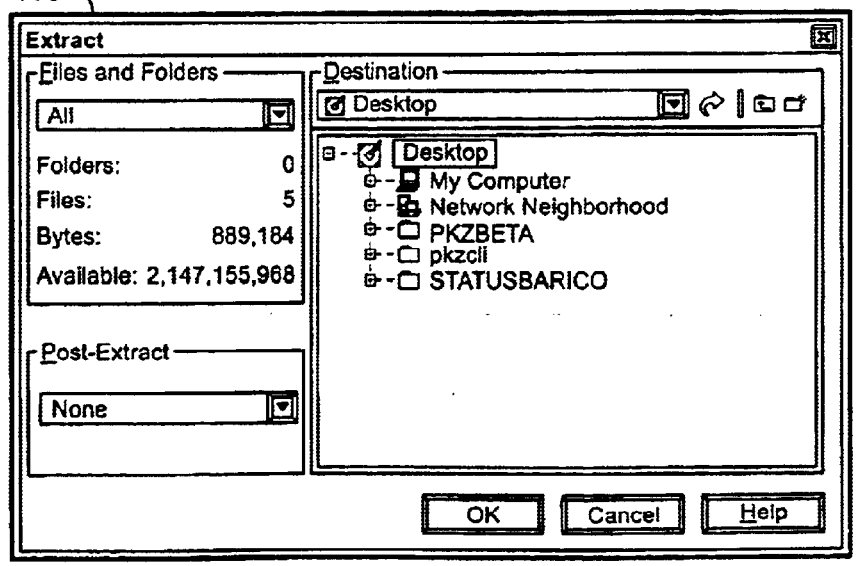

FIG. 7

SYSTEM AND METHOD FOR MANIPULATING AND MANAGING COMPUTER ARCHIVE FILES

CROSS REFERENCE TO RELATED APPLICATIONS

This application claims priority to U.S. Provisional Application No. 60/187,969 filed Mar. 9, 2000.

BACKGROUND OF THE INVENTION

The present invention relates to managing and manipulating computer archive files, and more particularly to a system and method for managing and manipulating zip files through a computer program integrated into Microsoft Windows Explorer.

Compression of computer files has been around for years. Compressing files can save tremendous amounts of disk space, and transfer time when downloading files from the Internet or transferring files through email. These days, almost any file one downloads from the Internet is compressed in some way. A standard compressed file or folder as it is sometimes called contains one or more files that were compressed into a single file or folder. A lot of different compression formats have been developed over the years. The zip format, created by the assignee of the present invention, is the most common compressed file format for the personal computer, but there are many others in use today. Any file with a ".zip" extension is most likely a compressed file in the zip format. Zipping a file means compressing the file into the zip format archive so that it occupies less disk space, and unzipping a file means uncompressing a compressed file in the zip format. A zip file is a file which has been compressed with PKZIP®, from PKWare, Inc., or another compatible archiver. Zip files are indicated by a ".zip" filename extension.

A computer file is compressed through the use of one or more compression algorithms. A compression algorithm is essentially a mathematical formula that scans the data in the file for compressible information. For example, compressible information may be any repeating pattern or string that can be represented once. The compression algorithm will then represent the repeated patterns in a coded manner to save space. For standard compression, most of the compression algorithms work basically the same way. Some are just more efficient or faster than others.

Generally, the contents of a compressed file cannot be accessed unless the archive is uncompressed. In order to uncompress a file, a user needs to either use the same program used to compress the file, or use another program that is compatible with the particular compression format. That meant that users were required to use standalone programs to compress and uncompress their files. The same problem occurs when trying to work with and manipulate compressed archived files. For example, a user wanting to open an existing compressed file, modify the file, or extract data from the file and transfer it to another file would have to command a standalone program to uncompress the original file and command the standalone program to compress the modified file. This process is often burdensome and inconvenient to the user. Therefore, it would be beneficial to create a product that would eliminate the need for separate standalone compression programs, and eliminate the need to separately command a file to be uncompressed or compressed each time the file is opened, modified, or saved.

Such products have been developed by many companies, including products used in a Microsoft Windows Explorer environment. Microsoft Windows Explorer is a browser program in Widows for exploring directories, files, and folders in a computer system. In connection with Windows Explorer, Microsoft provides a shell name space extension application program interface (API) for software developers to use to integrate other software utility programs into Windows Explorer. Several companies have developed compression file manipulation programs using the Microsoft Windows Explorer interface. Some of these products include: ArjFolder by Raphael Mounier; Cab Viewer by Microsoft Corporation; CleverZip by Cleverness, Inc.; Zip Explorer Pro by Aeco Systems; Internet Neighborhood by Kno Ware, Inc.; Net Explore; ZipMagic by Mijenix Corporation; and Netzip Classic by Netzip Inc. The Internet Neighborhood and Net Explore products are file transfer protocol (FTP) products which integrate FTP sites into Windows Explorer, ZipMagic and Netzip Classic are device driver products.

ZipMagic, patented under U.S. Pat. No. 5,907,703, is directed to a device driver for accessing computer files. The ZipMagic patent utilizes a device driver implemented in the operating system of Windows Explorer that makes all zip files appear to be folders.

However, all of the above products are implemented differently from the present invention, and do not include many of the features of the present invention. Many of the above programs have increased performance overhead in processing (compressing/uncompressing) files continuously in and out, and it is often difficult for a user to determine if he is in a zip file or rather in a folder.

Accordingly, there is a need for a system and method for easy management and manipulation of archive files. The program of the present invention is intended for use on Microsoft Windows 9x, Me (Millennium Edition), NT 4.0, and 2000 systems. Windows 95 and NT 4.0 systems require Microsoft Internet Explorer 4.0 or greater.

SUMMARY OF THE INVENTION

The present invention provides a software utility program that is seamlessly integrated into Microsoft Windows Explorer. The program allows users to manage and manipulate their zip archive files without leaving the Explorer environment. Users may open, archive, compress, extract, create, modify and add to their zip archive files using Windows Explorer's context and pull-down menus, toolbars, copy and paste operators, and drag and drop operators. A mail compressor attachment module integrates into Microsoft Outlook to automatically archive files sent via email. An Internet plug-in module works with Internet Explorer 4.0+ or Netscape Communicator 4.0+ to facilitate the handling of downloaded zip files from the Internet. The Internet module allows a user to view and manipulate zip archive files downloaded from the Internet.

An archive manager provides quick access to a user's zip files stored on the computer. The archive manager can create a hierarchical tree representation of a zip file which allows quick and easy management and manipulation of complex zip archives. Shortcuts may also be optionally created and/or deleted by the archive manager. Double-clicking a shortcut will open a zip file under the archive manager. File shortcuts may be created using copy and paste operators, dragging a file into the archive manager, or via the scan and add function. File shortcuts are deleted by highlighting the shortcut and selecting delete on the keyboard or Windows Explorer menu. Shortcuts may be created that branch to a zip file's contents under a specified working directory as an alternative to working within the archive manager. Archive files may be extensively modified before the actual changes are saved. As a result, system overhead is minimized, as the resources required for such operations are only needed when the archive is actually saved. An edit mode of the archive manager during archive modification illustrates graphic instruction cue icons (indicating Add and Delete states) in the far left column of the Explorer Window.

In addition to easily opening, extracting, creating and modifying archive files, the present invention also includes several miscellaneous features or functions selectable by the user. These functions include edit-before-saving, digital certificate based file authentication and encryption, selecting compression methods by file type and spanning/splitting of archive files.

In one aspect of the invention, an edit-before-saving function that is useful during creating, opening, modifying or extracting an archive file. The edit-before-saving function provides graphic instruction cue icons (indicating Add and Delete states) next to archives that have been modified. Archives may be extensively modified before the actual changes are saved. As a result, system overhead is minimized, as the resources required for compressing and uncompressing are used only when the archives are actually saved.

In another aspect of the invention, a Public Key Infrastructure (PKI) based digital signature, file authentication and encryption function adds a layer of authenticity to the zip archive files. The invention includes a X.509 based authentication and encryption function which allows a user to digitally sign and encrypt individual files archived in a zip file and subsequently authenticate and decrypt those files upon extraction. Digitally signing a zip file allows one to detect whether the integrity of a zip file has been compromised. Encrypting a file denies access to the file's contents by unauthorized users. The ability to store a PMI based digital signature using standard X.509 based certificate (e.g., VeriSign Digital ID) information is a significant enhancement to the zip archive file format. This function allows users to digitally sign an archive file and its contents using a standard X.509 based digital certificate.

This function also allows a user to digitally sign the central directory of the zip file and to encrypt file names and supplemental information such as, but not limited to, file system security descriptor information.

In a further aspect of the invention, a user may select a compression method based on the type of file being saved. The compression methods include Store, Deflate, and DCL Implode. By default, the present invention compresses all files using the Deflate algorithm. A user may choose to compress all files using the Deflate algorithm, or may optionally modify the default method of compression, as well as the method to be used on a specified file type. In addition, a user may specify to use the 64 k dictionary version of the Deflate algorithm for improved compression.

The spanning function of the invention allows a user to span large zip archives over multiple removable media diskettes. The splitting function of the invention allows a user to divide an archive file into specified file segment sizes.

Various other features, objects, and advantages of the invention will be made apparent to those skilled in the art from the following detailed description and accompanying drawings.

BRIEF DESCRIPTION OF THE DRAWINGS

FIG. 5 displays a save as dialog screen of the present invention;

FIG. 6a displays a table of toolbar buttons used in the present invention;

FIG. 6b displays a table of menu items used in the present invention;

FIG. 7 displays an extract dialog screen of the present invention;

DETAILED DESCRIPTION OF THE INVENTION

Figure 1:
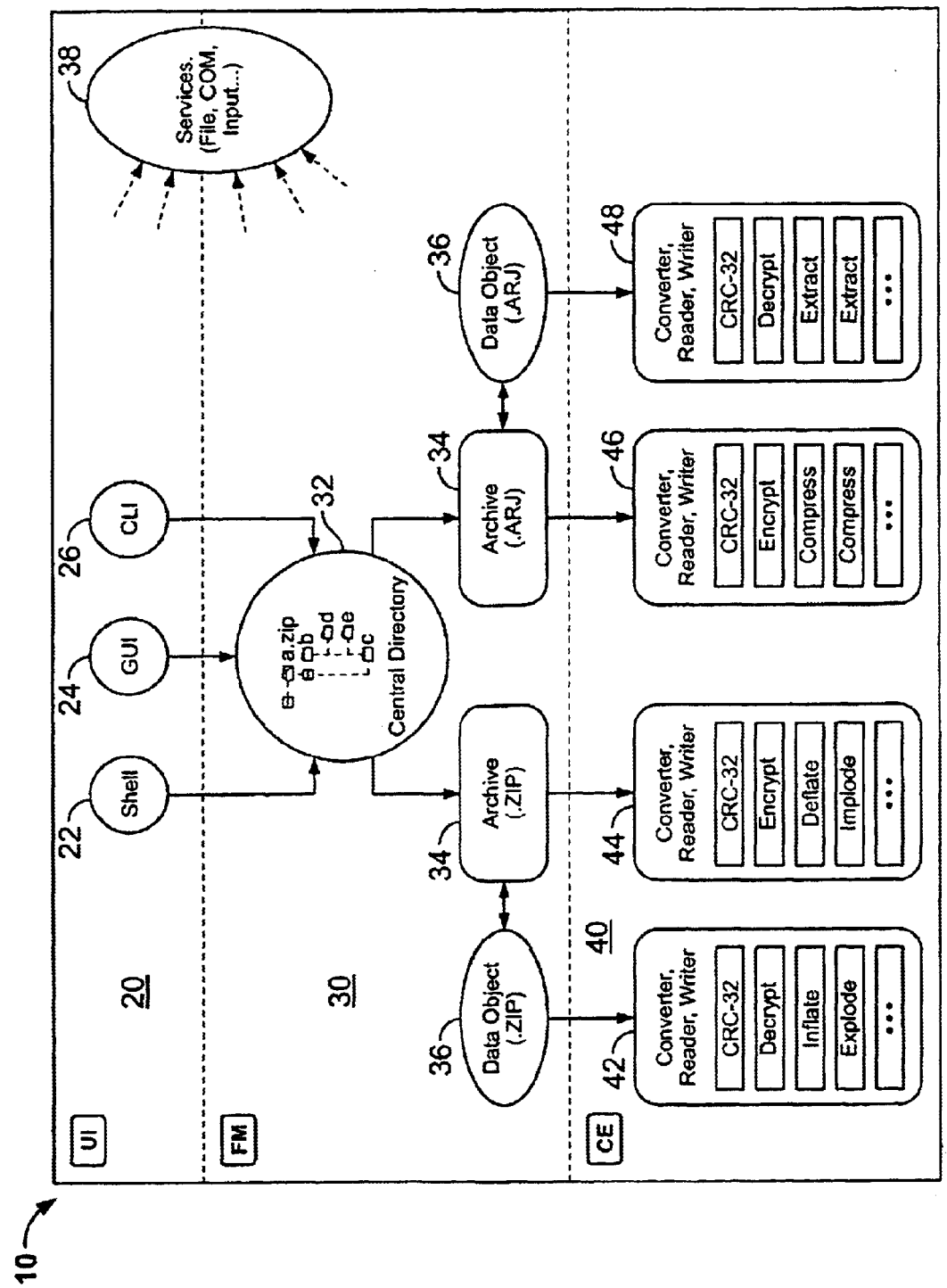
FIG. 1 is a diagram illustrating the software components underlying the system of the present invention.

FIG. 1 is a diagram illustrating the software components underlying the system 10 of the present invention There are three basic components of the underlying software. These components are the user interface (UI) 20, the file management (FM) component 30, and the compression/extraction engine (CE) 40.

The lowest level component is the compression/extraction engine 40. The compression/extraction component 40 consists of the actual compression, extraction, and CRC-32 algorithms in converter, reader, writer components 42, 44, 46, 48 interfacing with data object and archive files 34, 36 in the file management component 30. The compression, extraction and CRC-32 algorithms are written as a set of portable C language routines, with higher level C++ routines interfacing with the higher level file management component 30. The file management component 30 consists of the central directory 32 which holds a cached tree-like structure of the archive independent of the actual archive type. Actual archive implementation is used by the central directory 22 to read/write data to the archives 34 and the user interface 20. The central directory 32 consists of folder objects and file objects 36. A services object 38 is also part of the file management component 30. The services object 38 acts as a helper interface between the user interface component 20 and the file management component 30. The user interface 20 consists of a shell 22, a graphical user interface (GUI) 24, and a call level interface (CLI) 26.

The data object 36 supports one or more standard file formats (Explorer or File Manager drag and drop), and one or more custom formats (zip compressed non-encrypted and zip compressed). When files are dropped from Explorer to the archive, the archive requests available standard data formats to compress the data. When files are dropped from archive to Explorer, Explorer requests available standard data formats. In this instance, the data object will need to uncompress the data. When files are dropped from one zip archive to another zip archive, the target archive will be able to detect the native data and copy it without modification. When files are dropped from an ARJ archive to a zip archive, the zip archive will be able to recognize only standard formats, as a result, the ARJ data object will uncompress the data and the zip archive will compress the data. So it is possible to convert data between different archives.

Figure 2A:
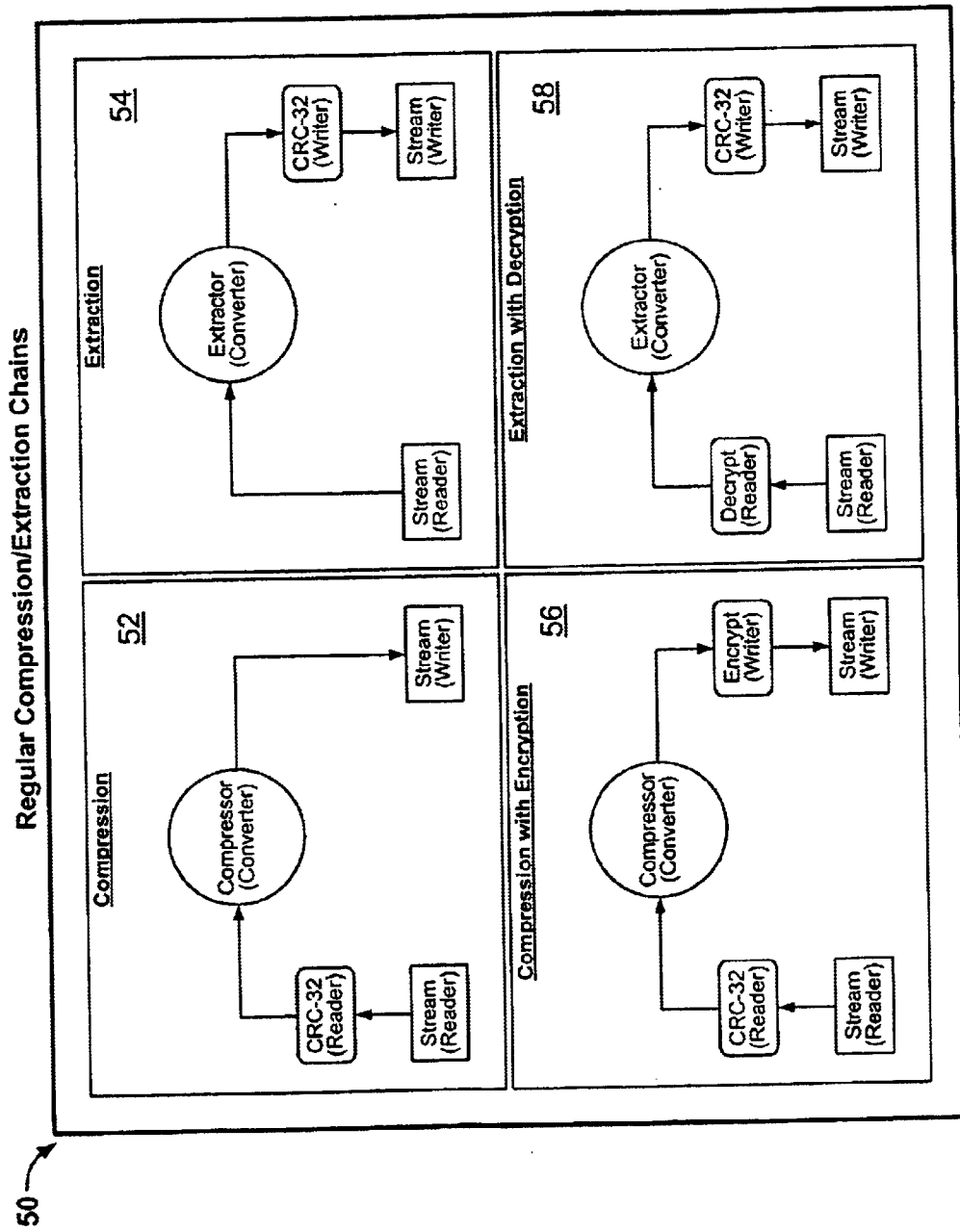
FIGS. 2a–2e are diagrams illustrating the different compression and extraction chains used in the present invention.
Figure 2B:
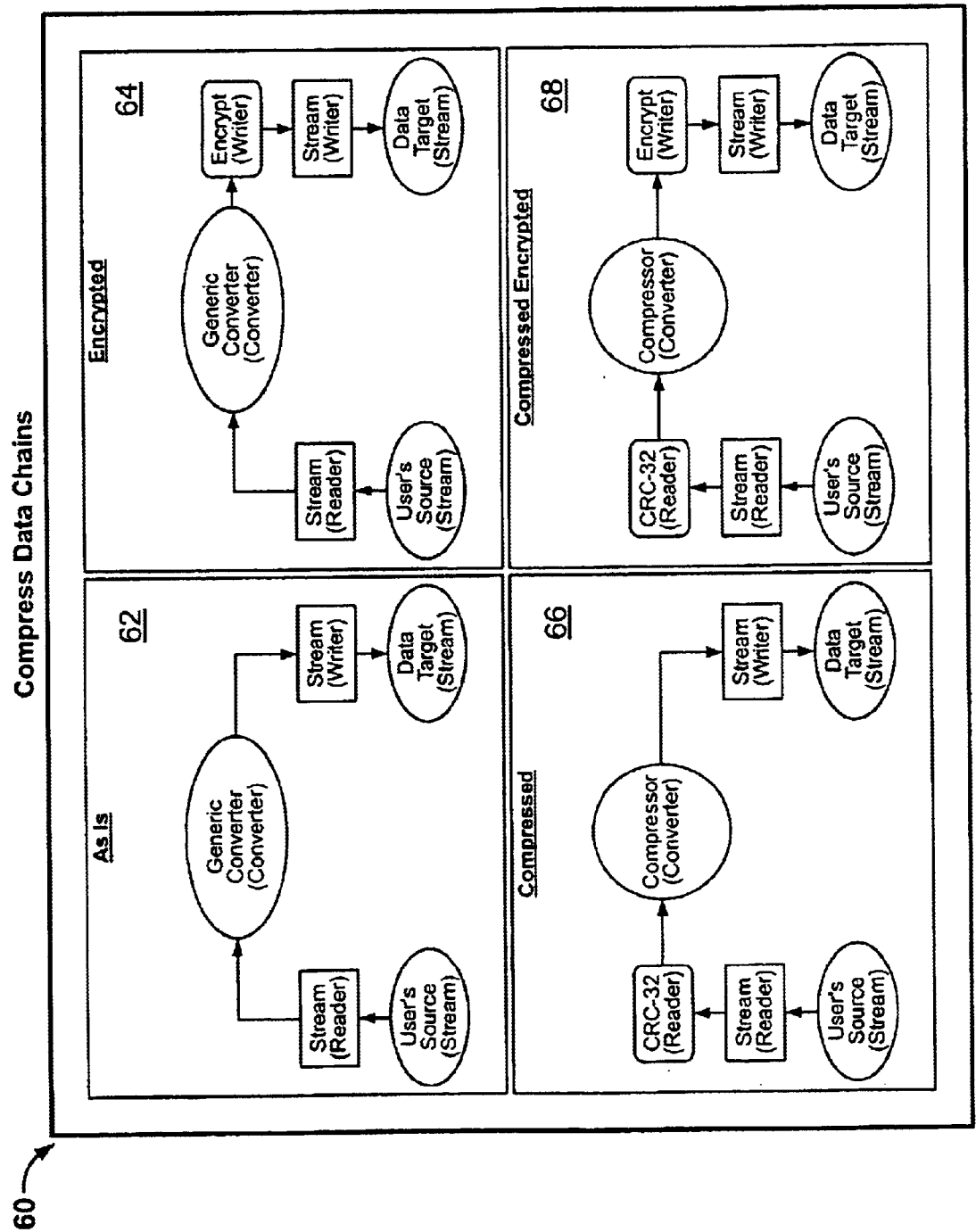
Figure 2C:
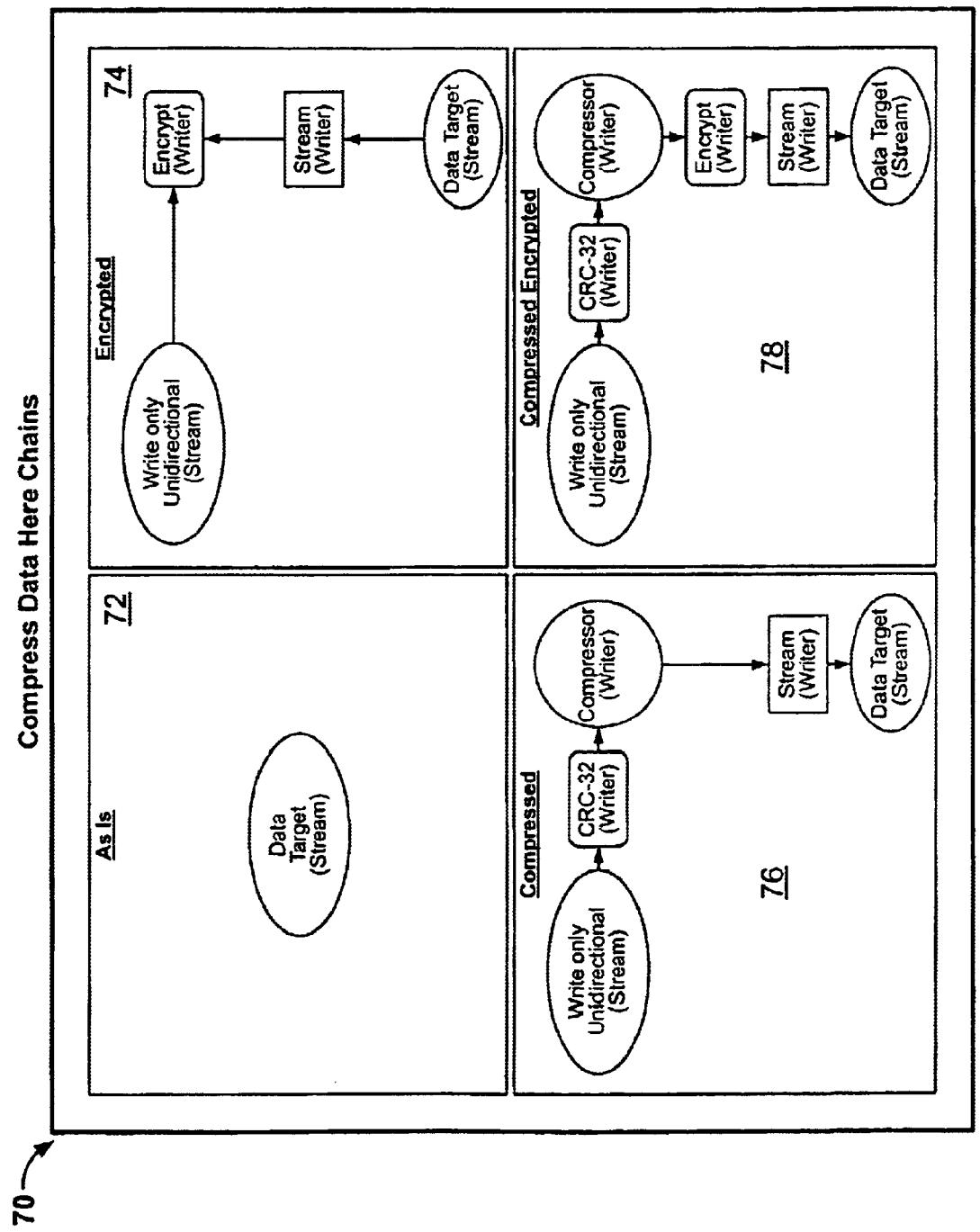
Figure 2D:
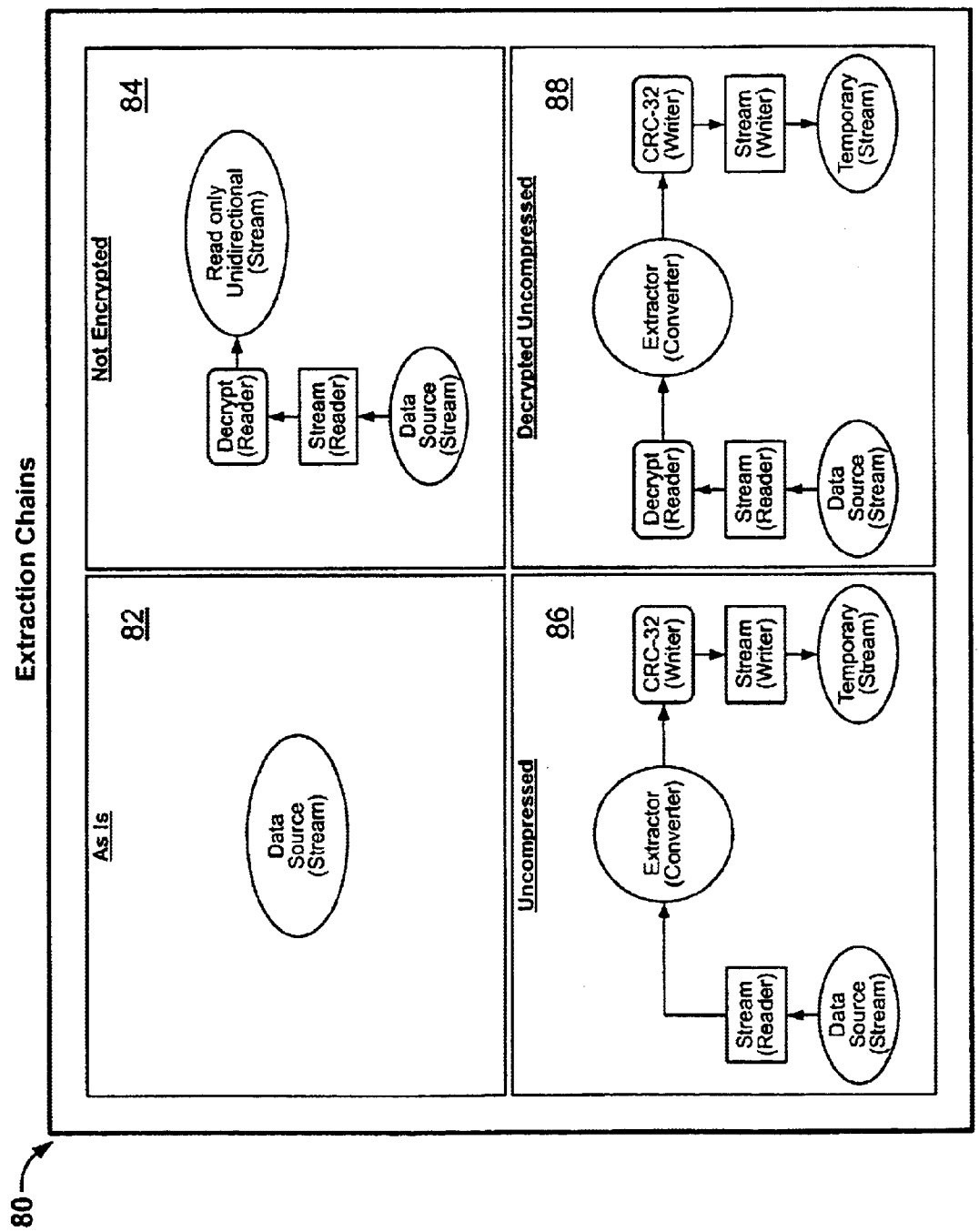
Figure 2E:
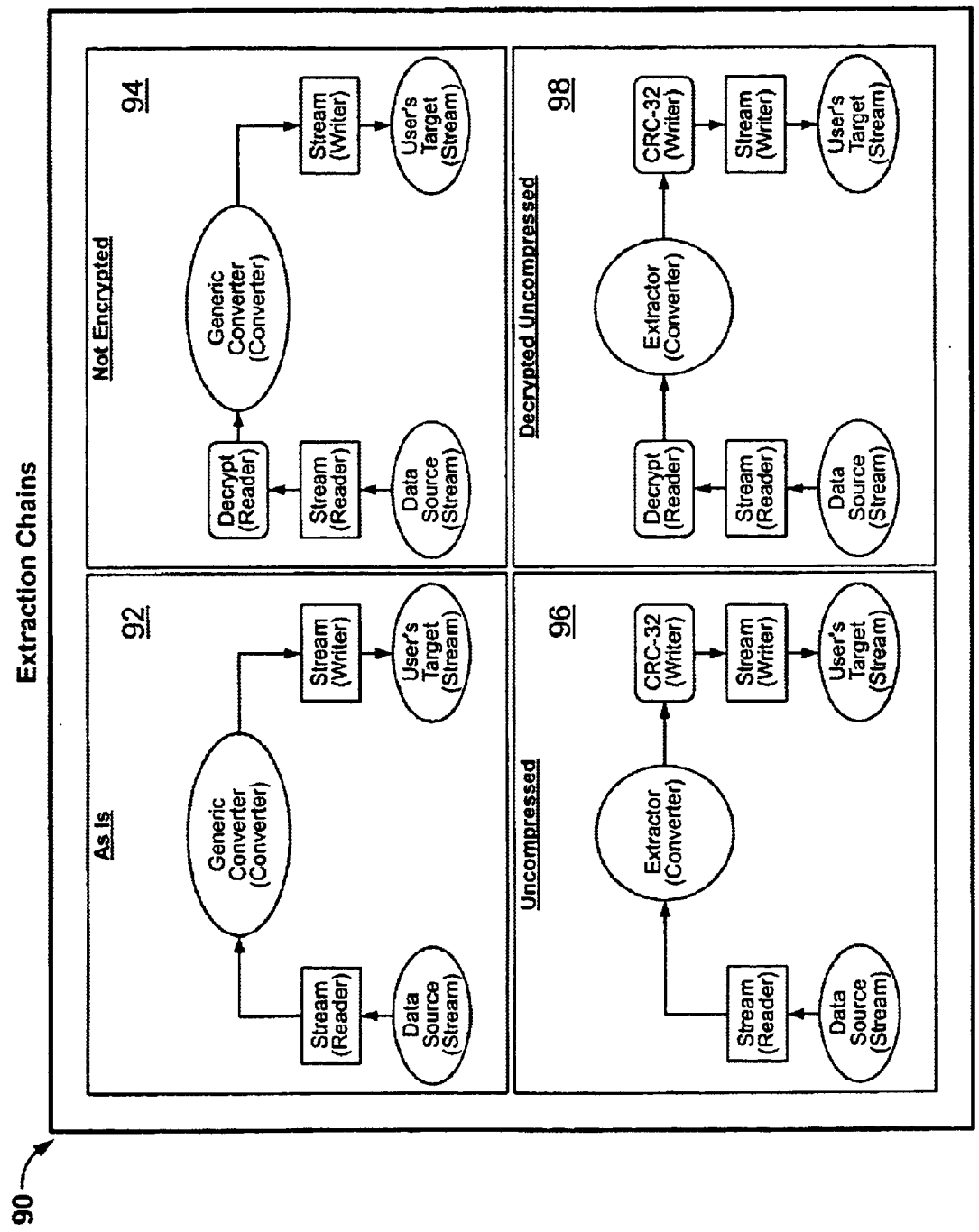

FIGS. 2a–2e illustrate the different compression and extraction used by the present invention. In FIG. 2a, regular compression and extraction chains 50 are shown. These chains 50 include chains for compression 52, extraction 54, compression with encryption 56, and extraction with decryption 58. In FIG. 2b, compression data chains 60 are shown, including the use of a generic converter involving no compression for as is files 62 and encrypted files 64. These compression data chains 60 further include chains for compressed files 66 and compressed encrypted files 68. In FIG. 2c, data here compression chains 70 are shown. These compress data here chains 70 include chains for as is files 72, encrypted files 74, compressed files 76 and compressed encrypted files 78. In FIG. 2d, GetData extraction chains 80 for as is files 82, not encrypted files 84, uncompressed files 86 and decrypted uncompressed files 88 are shown. In FIG. 2e, GetDataiHere extraction chains 90 for as is files 92, not encrypted files 94, uncompressed files 96 and decrypted uncompressed files 98 are shown.

The compression/extraction engine 40 and the file management component 30 form the data compression library that is used to build applications, such as the present invention, needing zip compatible compression and file management.

The present invention provides a software utility program that is integrated into Microsoft Windows Explorer for managing and manipulating archive files without leaving the Explorer environment. The invention includes an archive manager which allows a user to open, view, modify (add/delete), and extract data from an existing archive, or create a new archive using modified Windows Explorer right-click context menus, pull-down menus, toolbars, copy and paste operators, or drag and drop operators.

Figure 3:
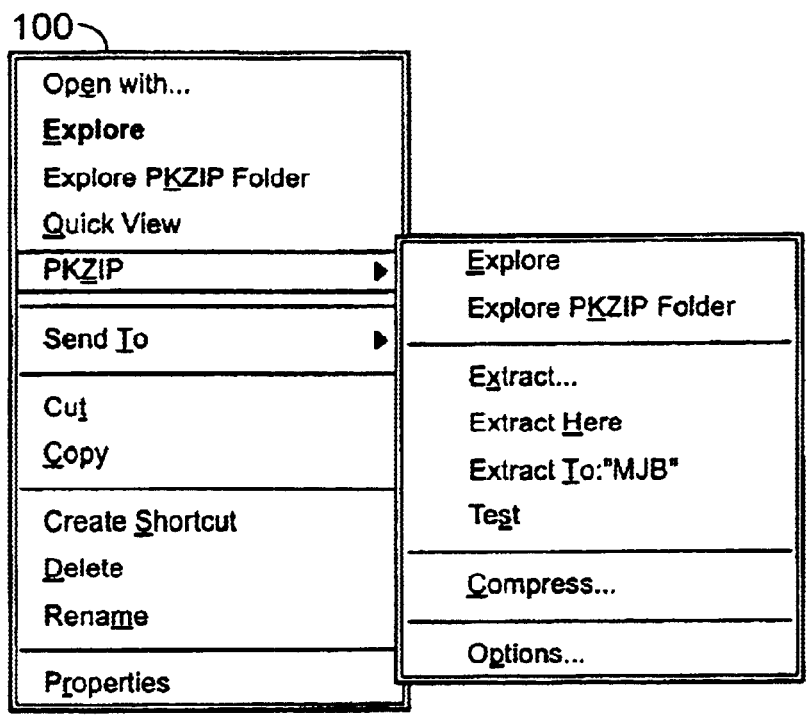
FIG. 3 displays a right-click context menu of the present invention.

FIG. 3 displays a right-click context menu 100 of the present invention which may be used to open, modify and extract files from an existing zip file, or create a new zip file. In opening a zip file, a user may simply double-click the file to view the contents of the file. Alternatively, the following is an example of the steps one might follow to open and view the contents of a zip file. First, the zip archive to be opened is located by using Windows Explorer. Then, the user right-clicks on the zip file he/she wants to open. A context menu appears. PKZIP|Explore is selected. The contents of the zip file will be displayed in the right pane under the archive manager. As another alternative, a user may select PKZIP|Explore PKZIP Folder to create a folder shortcut under the current folder, and display the contents of the zip file via this folder.

Figure 4:
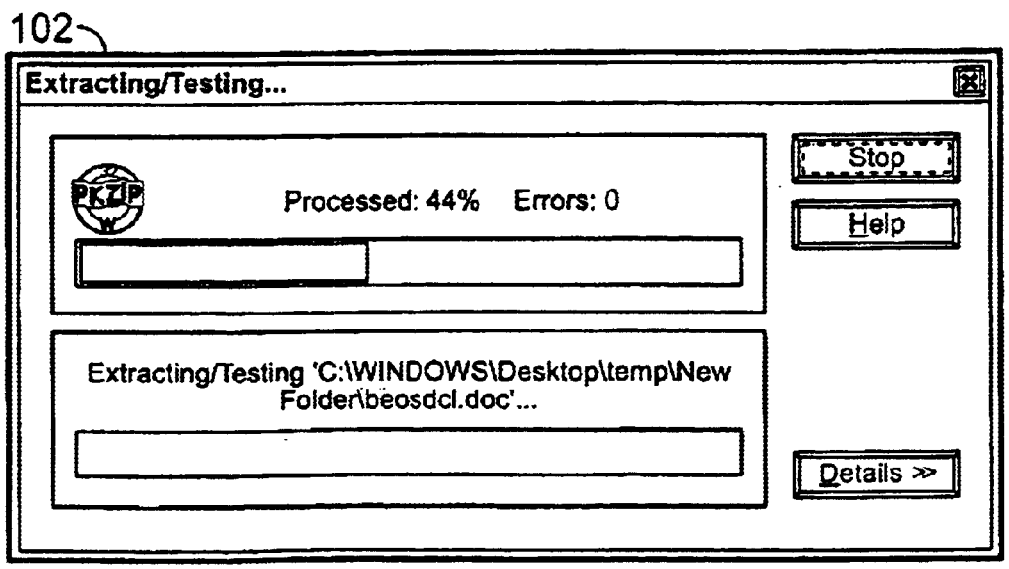
FIG. 4 displays a progress dialog screen of the present invention.
Figure 9:
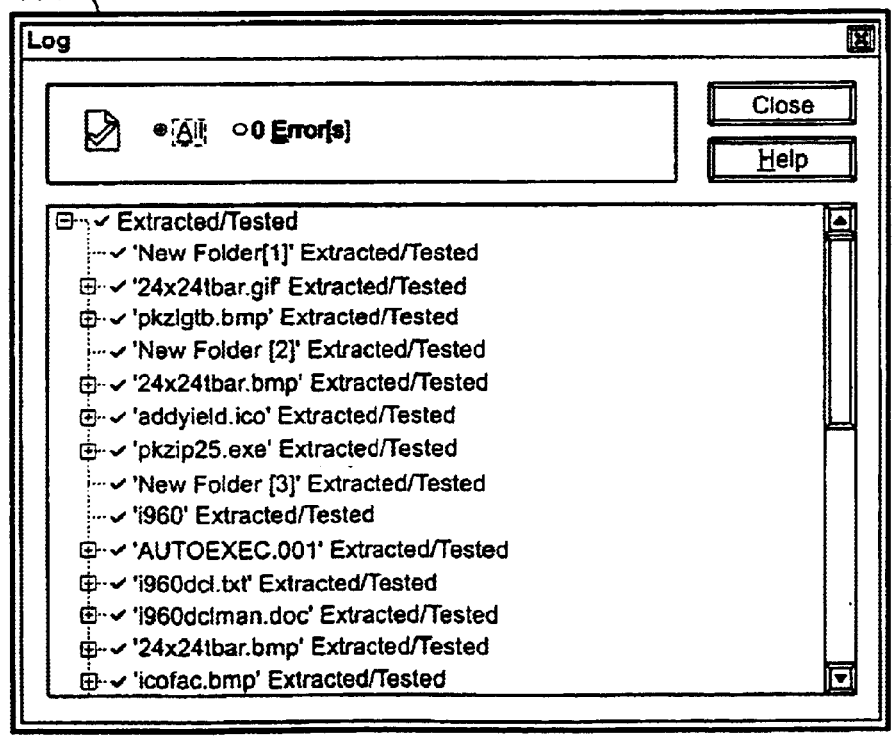
FIG. 9 displays a log dialog screen of the present invention.
Figure 10B:
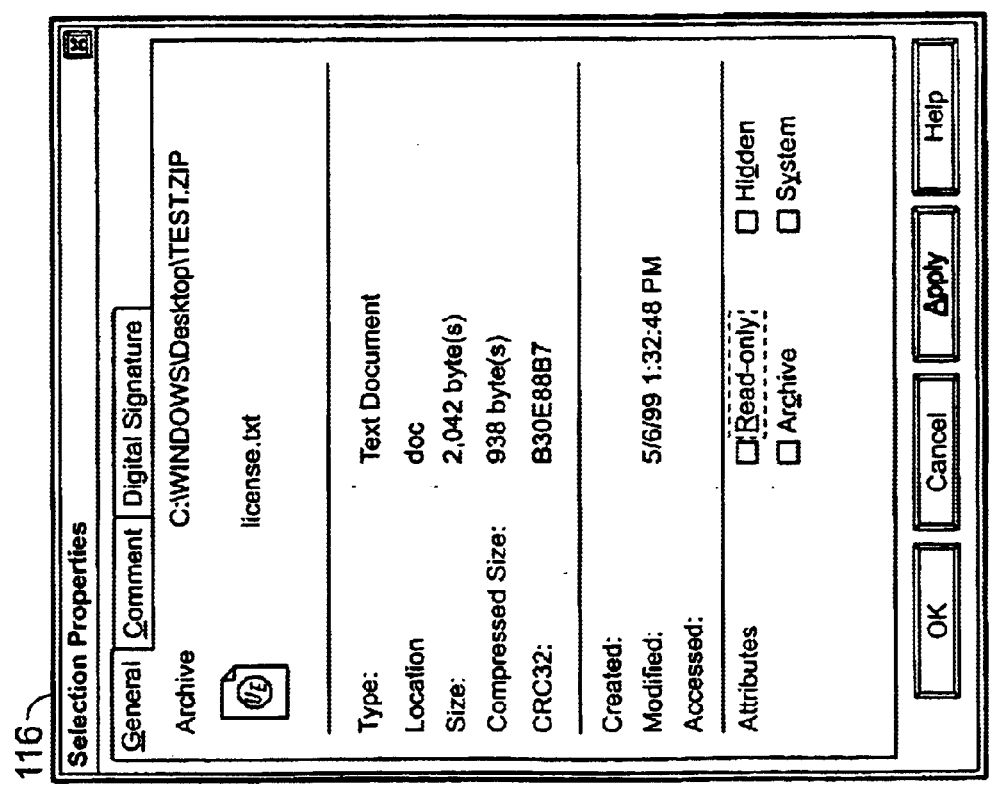
FIG. 10B displays a "Comment" screen of a series of selection properties dialog screens of the present invention.
Figure 10A:
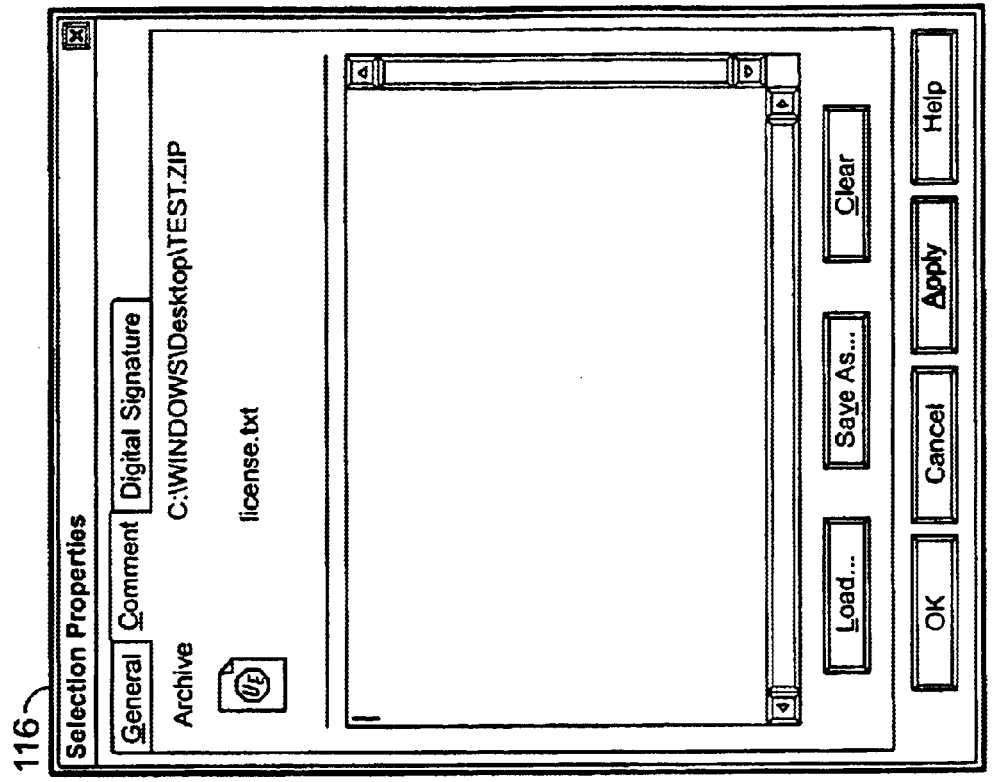
FIG. 10A displays a "General" screen of a series of selection properties dialog screens of the present invention.

To extract individual files and/or folders archived in a zip file, a user opens the zip file in Explorer as discussed above and invokes the Extract dialog 110, by selecting the PKZIP|Extract menu item in the right-click context menu. The Extract dialog 110 appears, FIG. 7, allowing the user to manually specify a destination directory. Alternatively, a user may select PKZIP|Extract Here to extract the contents of the archive into the directory where the zip archive resides. To create a directory (e.g., "Test") under the directory where the zip archive resides, and extract all files in that directory, the user selects the PKZIP|Extract-To menu item. Alternatively, files may be extracted using a drag and drop operation. The user highlights the files and/or folders he/she wishes to extract, drags the files to a destination, and drops the files in the enabled destination. The files and/or folders will be automatically extracted into the drop destination. As the extraction process proceeds, the progress is displayed in a progress dialog 102, as shown in FIG. 4. If there is an error encountered during the extraction process, the error is indicated in the progress dialog 102 and a Log dialog 104, shown in FIG. 9.

The present invention also allows a user to create a new zip file. The following is an example of the steps one might follow to create a new zip file. First, the user highlights the files and/or folders he wishes to archive. The user then clicks his right mouse button to bring up the context menu. PKZIP|Compress is then selected. The Save As dialog 104 appears, FIG. 5. A name and destination are specified for the zip file, and the Save button is clicked to proceed. The progress dialog 102 appears to monitor completion and to indicate errors in the process. The new zip file should now reside in the specified destination directory. A user may alternatively create a new zip file by other means as well. A user may create a new folder in an archive by selecting the New Folder menu toolbar item and specifying a folder name as desired.

Adding and/or deleting files in a zip file works somewhat differently than these same operations do in Explorer. For example, in Explorer, when a user highlights a file and clicks the delete key, that file is immediately deleted. The present invention includes an edit-before-saving function, so that when a user highlights a file and clicks the delete key, a graphic instruction cue icon is displayed directly to the left of the file icon, indicating that this file is to be deleted. Similarly, when a file is added to an archive, the program will display an add icon directly to the left of the file icon indicating that this file is to be added. In other words, a zip file is not actually modified until the user specifically instructs the program to save the zip file.

Figure 8:
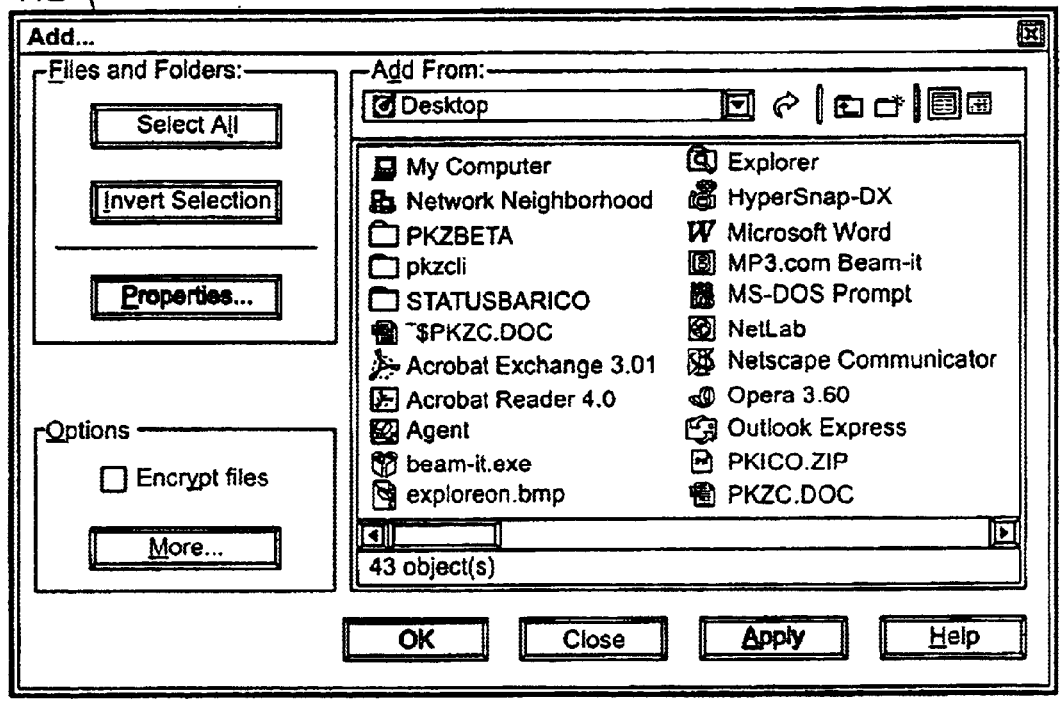
FIG. 8 displays an add dialog screen of the present invention.

The following is an example of the steps one might follow to modify an existing zip file. A user first locates and opens the zip file he/she wishes to modify. Next, the files and/or folders to add to the archive are specified by clicking the Add toolbar button, thereby invoking the Add dialog 112, illustrated in FIG. 8, or by dragging the files and/or folders from their source and dropping them at a destination. A user may alternately use the copy and paste operation to specify files and/or folders to add to the archive. The program will display an add icon (such as plus symbol) indicating that these files and/or folders are to be added when the archive is saved.

In a similar manner, a user may specify files and/or folders to delete in the archive by highlighting the files the user wishes to delete, and clicking the delete key, or by selecting the Delete menu item. The program will display a Delete icon (such as a circle with a slash through it) indicating that these files and/or folders are to be deleted when the archive is saved.

After the user is finished modifying the zip file, the file may be saved by selecting the Save menu item available under the File menu, or by use of the right-click context menu. A user may also click the Save button on the toolbar. To save the modifications to another zip file, select the Save As or Save Copy As menu items.

FIGS. 6a and 6b display modifications and additions to the Explorer toolbar buttons 106 and menu items 108 used in the present invention.

The present invention may also include many options which may be configured in the options tab dialog accessible via the menu/tool bar or via the right-click context menu. One option is the compression method. Under this option, a user may specify a compression algorithm other than the default algorithm. The compression algorithms to choose from may include Store, DCL Implode, and Deflate. By default, all files are compressed using the Deflate algorithm. As one example, a user may wish to use the Store feature for all JPEG files, since the compression ratios on files of this type are typically negligible. A user may specify a default method or extension specific method under the extension column. Depending on the compression method specified, a user may wish to configure one or more of the storage parameters, as described below.

There are no available settings for the store method. The program simply archives the specified files without compression. Since the program does not expend time compressing files, this is the fastest method of archival.

Under the DCL Implode method of compression, the dictionary byte size (ie., 1024, 2048, 4096) a user wishes to use when compressing files is configurable along with the data type. The binary setting should be selected to optimize compression of program files or other non-text files. The ASCII setting should be selected to optimize compression of text files.

Most zip utilities use the Deflate algorithm to compress files. Under this algorithm, the compression level may be set using a slide bar to specify the level of compression you wish to apply when archiving files. Moving the slide bar all the way left instructs the program to use the fastest method of compression. Moving the slide bar right increases the time the program expends compressing the file which, as a result, improves compression. Moving the slide bar all the way right instructs the program to apply maximum compression to files. This is the slowest method of file archival because the program must expend time maximizing compression on the files. Typically, applying maximum compression results in the smallest zip file.

In addition, the dictionary kilobyte size may be selected when using the Deflate algorithm. The dictionary size is selectable between a 32K dictionary and a 64K dictionary. The 64K dictionary provides slightly better compression ratios, but may not be compatible with all zip utilities.

The present invention also allows the user to digitally sign and encrypt the individual files archived in a zip file as well as the central end directory, and subsequently to authenticate and decrypt those files upon extraction. The signing and encrypting functionality is based on PKCS No. 7, and related public key encryption standards and is therefore compatible with security functionality in other applications such as Microsoft's Internet Explorer. Signing a zip file allows one to detect whether a zip file's integrity has been compromised. Encrypting a file denies access to the file's contents by unauthorized users. These features are illustrated in the ZIP Components Properties and Digital ID Properties dialog screens 118 as shown in FIG. 11.

Before a user can sign or encrypt files, he must first have a digital certificate with which to sign or encrypt. A digital certificate may be obtained from VeriSign or Thawte or from another certificate authority.

FIG. 10 illustrates the Selection Properties dialog screens 116 used in accordance with the software program of the present invention.

The present invention also provides a software utility program that integrates the compression/extraction engine into Microsoft Outlook to compress, encrypt and authenticate email attachments without leaving the Outlook environment. The invention includes a toolbar button and a tooltray menu that allows turning the compression of email attachments on or off. The compression of email attachments reduces the storage and transfer time of email messages and can reduce the spread of common email attachment viruses.

The system of the present invention may further include a more generally applicable mail attachment compressor module. Most email programs support sending file attachments along with the main body of the email message. Most users can choose to send the attached file as it originally exists, or compress it prior to attachment to the mail message so it is smaller and more efficient to send and store. Currently, the file to be attached must be manually compressed outside the email program and then attached using the attachment features of the email program. The mail attachment compressor module of the present invention integrates compression into the standard Microsoft Outlook mail message edit form so compressing attachments can be done automatically as the message is sent. The mail attachment compressor module also provides the ability to digitally sign attachments as they are sent for greater security.

After installing the program of the present invention, the mail form of Microsoft Outlook will have two additional buttons in its "standard" toolbar. These buttons include a Toggle Compression button and an Options button. If the Toggle Compression button is not depressed (the default state), all mail attachments will be compressed automatically when the standard "send" button is used to send the message. Attachments already compressed when attached will be left as is, while attachments that are not compressed will be compressed into a single .ZIP file that will replace the original uncompressed attachments. When the Toggle Compression button is depressed, the compression will not be done and the files will be sent as attached. The Options button will display the Options configuration dialogs from the compression/extraction engine so that the compression actions can be configured. The primary use of this button is to configure digital certificates, but any configurable parameters supported by the compression/extraction engine can be set. These parameters include digital certificates, passwords and compression method options.

Operation of the mail attachment compressor program is initiated by installing the mail attachment compressor module software onto the users system, and initiating Microsoft Outlook. If the mail attachment compression feature is enabled through the toggle button, the attachments will automatically be compressed when the message is sent using the send button. If the mail attachment compression feature is not enabled, then the attachments will be sent unaltered.

The components of the mail attachment compressor module provide the functionality to be implemented within Microsoft Outlook and provide integration between this module and the underlying compression/extraction engine. When compressing an attachment, the files to be compressed will be passed off to the compression/extraction engine of the underlying software program. After compression, the compressed file will be reattached to the original message, the original copies of the attachments that are now compressed will be removed from the message, and any temporary files created during compression will be deleted.

The mail attachments module uses the compression/extraction engine to hook directly into Microsoft Outlook to allow users to compress email attachments into zip files. This module provides an automation hook so that email attachments appended to Outlook mail messages can be automatically compressed when the message is sent.

The Scan and Add dialog of the archive manager is invoked via the Scan and Add toolbar button or the Explorer File/right-click menu. Once the user is finished specifying files to add to the archive manager list, the user clicks OK to add the selected file shortcuts to his list and return to Explorer, or he clicks Apply to add the selected files and remain in the Scan and Add dialog. The options available via this dialog include Files and Folders, multiple selection scan, and Scan and Add form. The archive manager allows the user to add unopened archives to the archive manager list, and to add multiple files using the multiple selection scan option under the archive manager.

While the invention has been described with reference to preferred embodiments, those skilled in the art will appreciate that certain substitutions, alterations and omissions may be made without departing from the spirit of the invention. Accordingly, the foregoing description is meant to be exemplary only, and should not limit the scope of the invention set forth in the following claims.

What is claimed is:

1. A system for managing and manipulating computer archive files that are in a .ZIP format, the system comprising:
   a software utility program library that integrates as a callable program module into existing file management software programs installed on a computer, the software utility program library including:
      a user interface integrated into the file manager software programs' user interface interfacing with a central directory;
      a file manager interfacing with archive files and data object files for opening, viewing and modifying archive files and data object files, extracting and adding data to archive files and data object files, and creating new archive files and data object files; and
      a compression/extraction engine interfacing with the file manager for compressing, extracting, authenticating, encrypting and decrypting archive files and data object files; accessing the software utility program library to manage and manipulate archive files stored in computer memory without leaving the file management application program's menus toolbars, and/or drag and drop operators.

2. The system of claim 1 wherein the user interface includes a shell, a graphical user interface and a call level interface.

3. The system of claim 1 wherein the file manager includes the central directory which stores the archive files.

4. The system of claim 1 wherein the compression/extraction engine includes compression and extraction algorithms.

5. The system of claim 1 wherein the user interface, file manager and compression/extraction engine are integrated into the file management software programs.

6. The system of claim 1 further comprising an email attachment compressor module for automatically compressing email attachments.

7. The system of claim 6 wherein the email attachment compressor module is implemented within an existing email application program previously installed on the user's computer and integrated with the compression/extraction engine.

8. The system of claim 7 wherein the email attachment compressor module integrates compression into the email application program's email message edit form.

9. The system of claim 7 wherein the email attachment compressor module provides digital certificate based file authentication of attachments as the emails are sent.

10. The system of claim 7 wherein the email attachment compressor module includes parameters for configuration of digital certificate based file authentication, encryption, and compression method options.

11. A method of managing and manipulating computer archive files, the method comprising the steps of:
   integrating a software utility program library into an existing file management application program installed on a computer; and
   accessing the software utility program library to manage and manipulate archive files stored in computer memory without leaving the file management application program environment by using the file management application program's menus, toolbars, and/or drag and drop operators.

12. The method of claim 11 wherein managing archive files includes opening and viewing the contents of archive files.

13. The method of claim 11 wherein manipulating archive files includes creating new archive files.

14. The method of claim 11 wherein manipulating archive files includes modifying existing archive files.

15. The method of claim 11 wherein manipulating archive files includes extracting data from archive files.

16. The method of claim 11 wherein manipulating archive files includes authenticating and encrypting archive files.

17. The method of claim 11 further comprising the step of integrating an email attachment compression module into an existing email application program installed on a computer for automatically authenticating, encrypting and compressing email attachments without leaving the email application program environment.

18. The system of claim 1 wherein the archive files are in a .ZIP format.

19. The system of claim 1 further comprising an email attachment compressor module for automatically archiving and compressing email attachments.

20. The system of claim 1 wherein the system is integrated into the file management software programs using a shell name space extension application program interface and accessed by the browser's menus, toolbars, and/or drag and drop operators.

21. The system of claim 1 further comprising an Internet plug-in module integrated into an existing Internet browser installed on a computer for managing and manipulating archive files downloaded from the Internet.

22. The system of claim 7 wherein the email attachment compressor module provides encryption of attachments as the emails are sent.

23. A system for compressing email attachments comprising:
   a software utility program library that integrates as a callable program module into existing email application software programs installed on a computer, the software utility program library including:
      an email attachment compressor module interfacing with the email application program, the email attachment compressor module having a compression/extraction engine for automatically compressing email attachments into .ZIP files as the emails are sent; accessing the software utility program library to manage and manipulate archive files stored in computer memory without leaving the file management application program's menus toolbars, and/or drag and drop operators.

24. The system of claim 23 wherein the compression/extraction engine provides parameters for configuration of digital certificate based file authentication, encryption and compression method options of the email attachments.

25. A system for managing and manipulating archive files in a .ZIP format downloaded from the Internet comprising:

a software utility program library that integrates as a callable program module into existing web browser software programs installed on a computer, the software utility program library including:

an Internet module having a file manager and interfacing with the web browser for managing and manipulating archive files downloaded from the Internet; and a compression/extraction engine interfacing with the web browser for compressing, extracting, authenticating, encrypting and decrypting the archive files; accessing the software utility program library to manage and manipulate archive files stored in computer memory without leaving the file management application program's menus toolbars, and/or drag and drop operators.

26. The system of claim 1 wherein the callable program module facilitates the use of files, archives and email attachments between and among diverse application programs.

27. The method of claim 11 wherein the software utility program facilitates the use of files, archives and email attachments between and among diverse application programs.

28. The system of claim 23 wherein the callable program module facilitates the use of files, archives and email attachments between and among diverse application programs.

29. The system of claim 25 wherein the callable program module facilitates the use of files, archives and email attachments between and among diverse application programs.

* * * * *

UNITED STATES PATENT AND TRADEMARK OFFICE
CERTIFICATE OF CORRECTION

PATENT NO. : 6,879,988 B2
APPLICATION NO. : 09/803355
DATED : April 12, 2005
INVENTOR(S) : Basin et al.

Figure 11A:
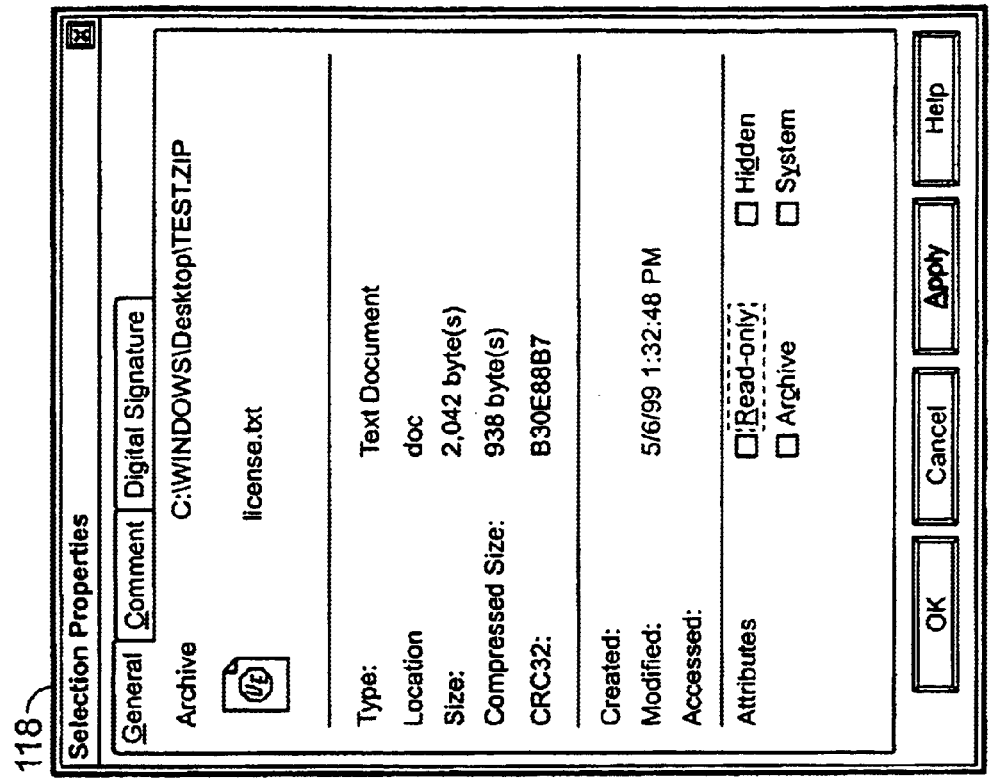
FIG. 11A displays a "General" screen of a series of authenticity/certificate dialog screens of the present invention.
Figure 10C:
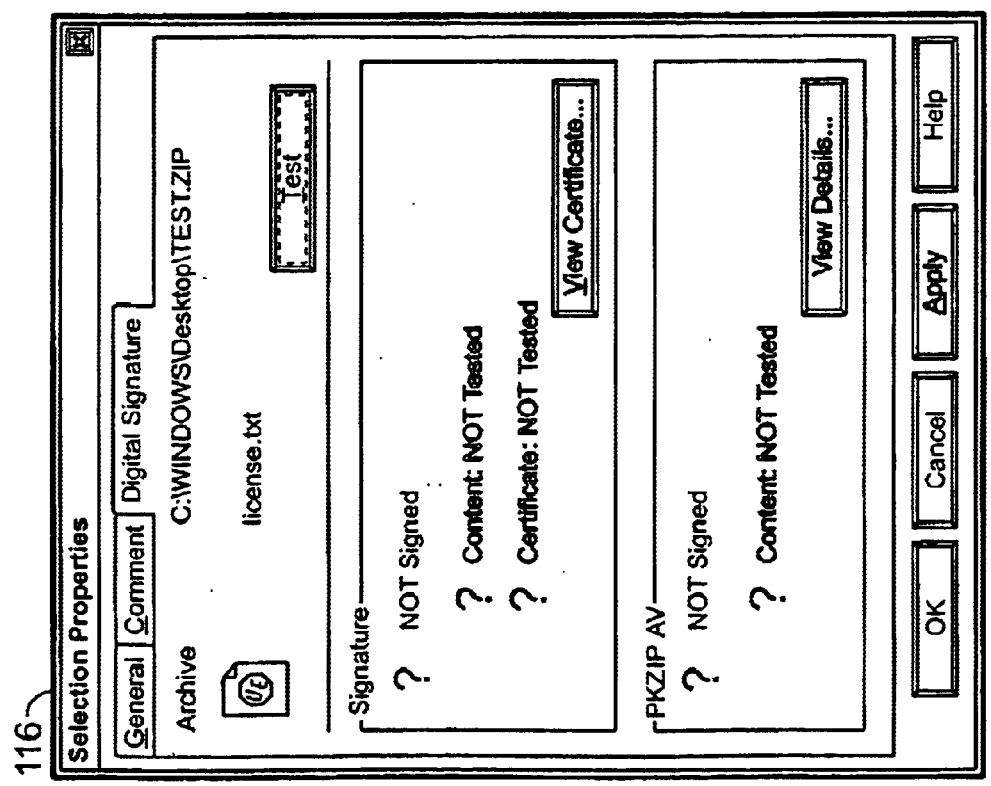
FIG. 10C displays a "Digital Signature" screen of a series of selection properties dialog screens of the present invention.
Figure 11C:
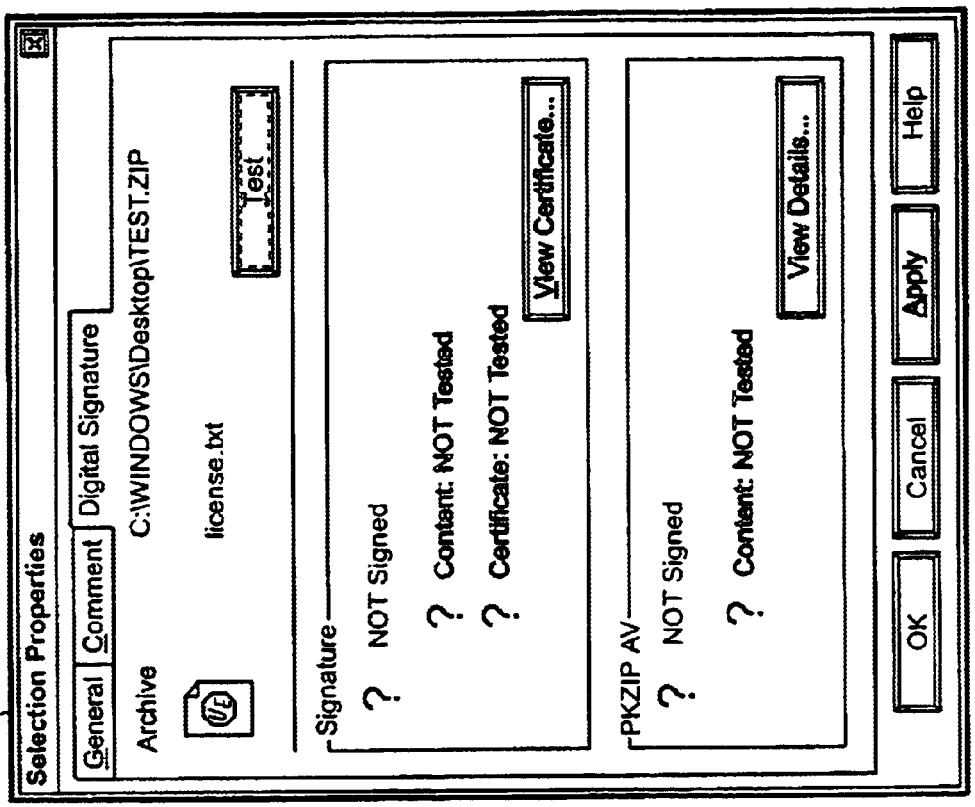
FIG. 11C displays a "Digital Signature" screen of a series of authenticity/certificate dialog screens of the present invention.
Figure 11B:
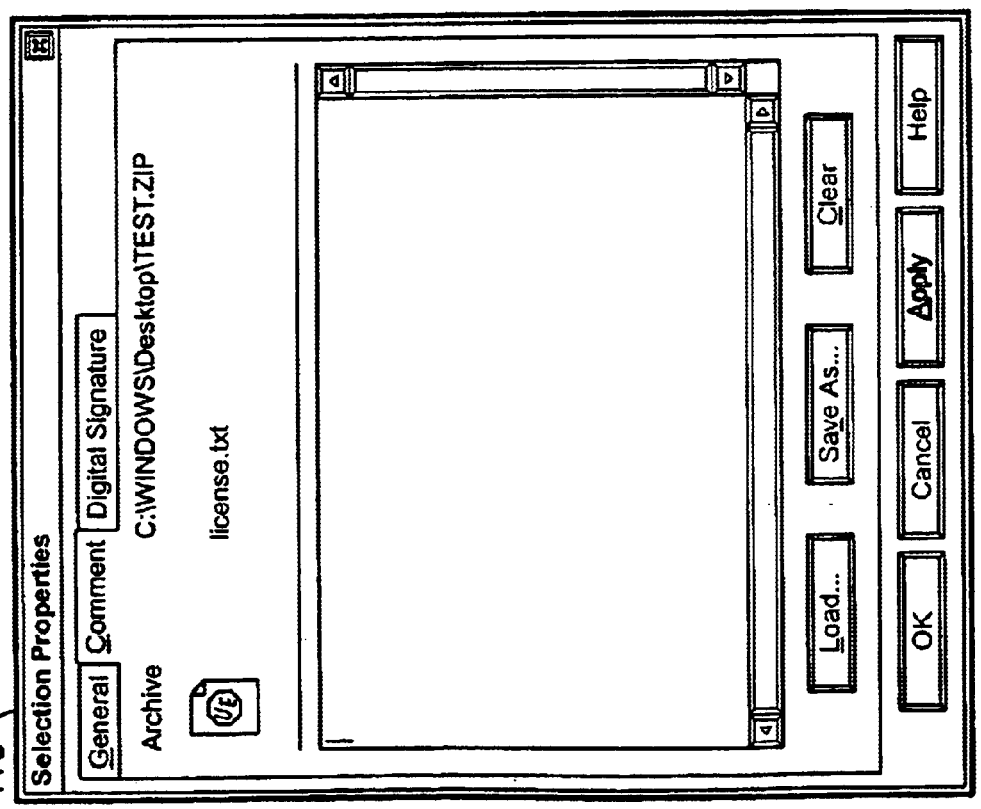
FIG. 11B displays a "Comment" screen of a series of authenticity/certificate dialog screens of the present invention.
Figure 11A:
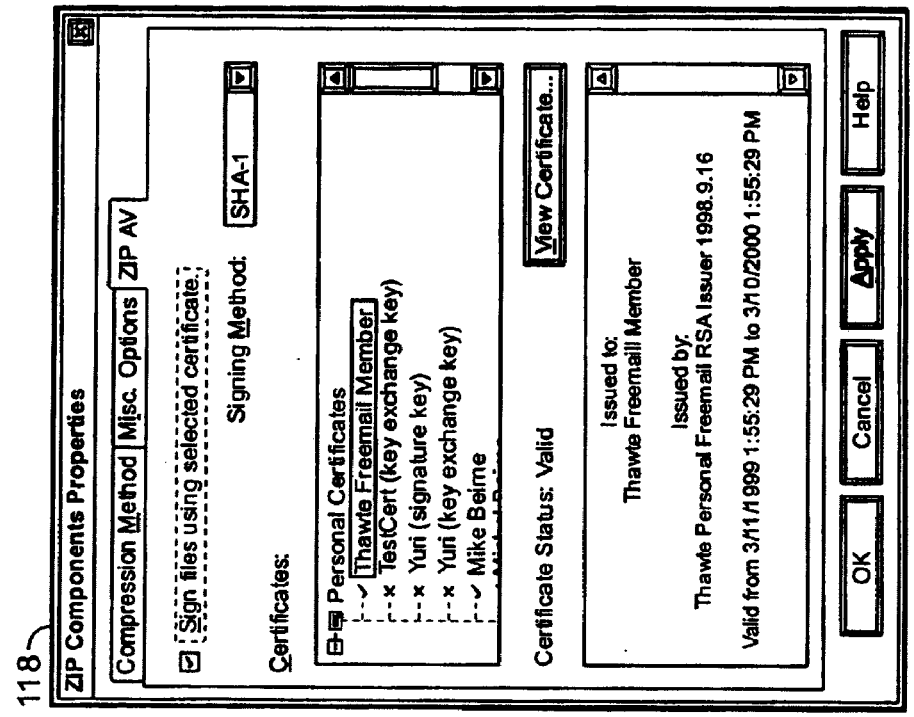
Figure 10C:
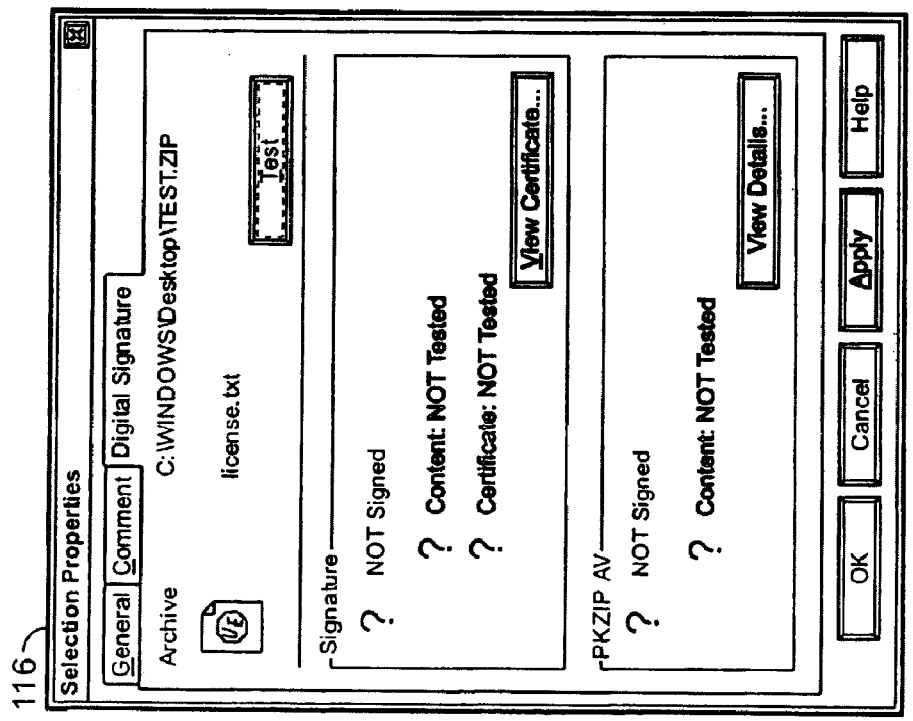
Figure 11C:
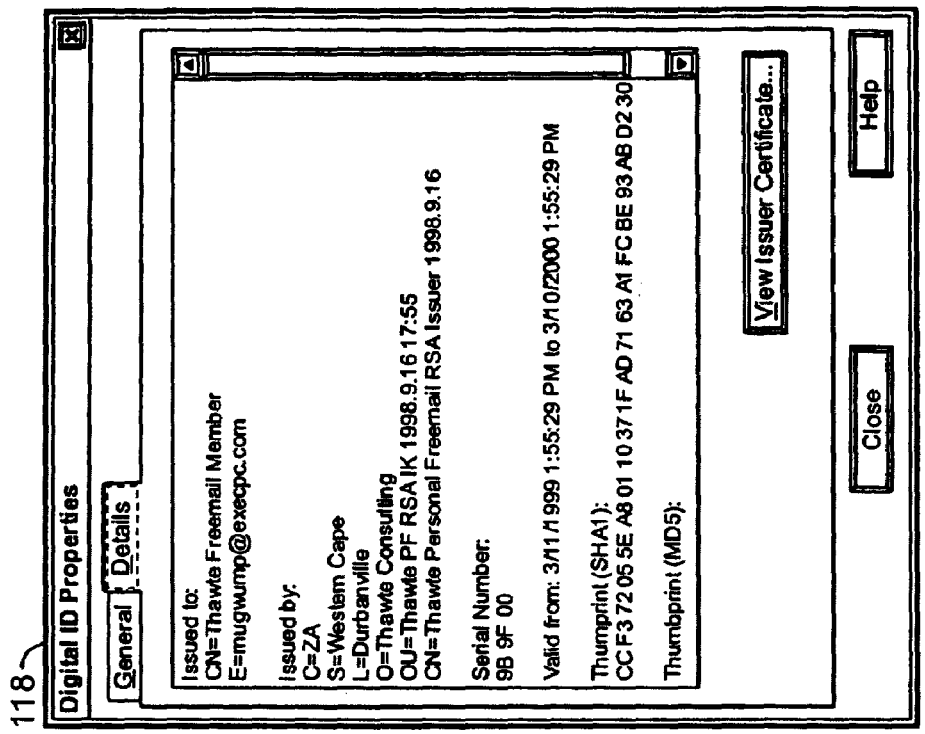
Figure 11B:
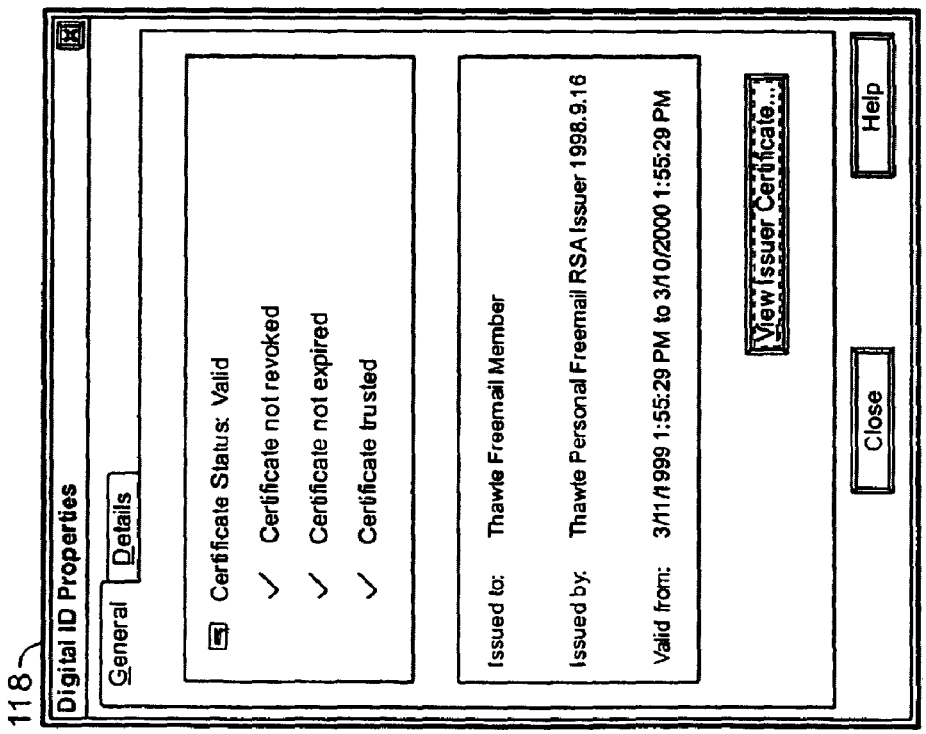

It is certified that error appears in the above-identified patent and that said Letters Patent is hereby corrected as shown below:

Drawing sheets, consisting of Fig. 11A, 11B and 11C, should be deleted and replaced with the drawing sheets, consisting of Fig. 11A, 11B and 11C, as shown on the attached pages.

Signed and Sealed this

Third Day of October, 2006

JON W. DUDAS
*Director of the United States Patent and Trademark Office*